(12) United States Patent
Van Eijk et al.

(10) Patent No.: US 7,767,971 B2
(45) Date of Patent: Aug. 3, 2010

(54) HIGH LIGHT YIELD FAST SCINTILLATOR

(75) Inventors: Carel Wilhelm Eduard Van Eijk, Delft (NL); Hans-Ulrich Guedel, Thoerishaus (CH); Karl Wilhelm Kraemer, Berne (CH); Muhammad Danang Birowosuto, Kelapa Gading (ID); Pieter Dorenbos, Rijswijk (NL)

(73) Assignees: Stichting Voor de Technische Wetenschappen, Utrecht (NL); Universite de Berne, Berne (CH)

( * ) Notice: Subject to any disclaimer, the term of this patent is extended or adjusted under 35 U.S.C. 154(b) by 0 days.

(21) Appl. No.: 12/067,099

(22) PCT Filed: Sep. 15, 2006

(86) PCT No.: PCT/EP2006/066427

§ 371 (c)(1), (2), (4) Date: Jun. 24, 2008

(87) PCT Pub. No.: WO2007/031583

PCT Pub. Date: Mar. 22, 2007

(65) Prior Publication Data

US 2009/0039269 A1  Feb. 12, 2009

(30) Foreign Application Priority Data

Sep. 16, 2005 (EP) ................................. 05020224
Sep. 20, 2005 (EP) ................................. 05108644

(51) Int. Cl.
*G01T 1/164* (2006.01)

(52) U.S. Cl. .............................. 250/361 R; 250/363.03
(58) Field of Classification Search ............. 250/361 R, 250/363.03
See application file for complete search history.

(56) References Cited

U.S. PATENT DOCUMENTS 7,067,815 B2   6/2006   Dorenbos et al.
7,067,816 B2   6/2006   Dorenbos et al.

(Continued)

FOREIGN PATENT DOCUMENTS

EP         1 553 430        7/2005

(Continued)

OTHER PUBLICATIONS

Urland, W., "Electronic Structure and Co-Ordination Geometry of PR$^{3+}$-Doped Rare Earth Trichlorides", Journal of the Less-Common Metals, vol. 148, pp. 151 to 157, 1989.

*Primary Examiner*—David P Porta
*Assistant Examiner*—Mindy Vu
(74) *Attorney, Agent, or Firm*—Oblon, Spivak, McClelland, Maier & Neustadt, L.L.P.

(57) ABSTRACT

The invention concerns a material comprising a compound of formula $Pr_{(1-x-y)}Ln_yCe_xX_3$ wherein—Ln is chosen from the elements or mixtures of at least two elements, of the group: La, Nd, Pm, Sm, Eu, Gd, Y, —X is chosen from the halides or mixtures of at least two halides, of the group: Cl, Br, I, —x is above 0.0005 and is lower than 1, —y is from 0 to less than 1 and—x+y) is less than 1, and its use as scintillation detector, for example in PET scanner with time of flight capabilities.

21 Claims, 4 Drawing Sheets

U.S. PATENT DOCUMENTS

| | | |
|---|---|---|
| 7,233,006 B2 | 6/2007 | Dorenbos et al. |
| 7,250,609 B2 | 7/2007 | Dorenbos et al. |
| 7,332,028 B2 | 2/2008 | Iltis et al. |
| 2004/0149917 A1 | 8/2004 | Dorenbos et al. |
| 2005/0082484 A1* | 4/2005 | Srivastava et al. ....... 250/361 R |
| 2006/0104880 A1 | 5/2006 | Iltis |
| 2007/0018107 A1* | 1/2007 | Fukuda et al. .......... 250/361 R |
| 2007/0090328 A1 | 4/2007 | Dorenbos et al. |
| 2007/0241284 A1 | 10/2007 | Iltis |

FOREIGN PATENT DOCUMENTS

| | | |
|---|---|---|
| EP | 1 557 695 | 7/2005 |

* cited by examiner

HIGH LIGHT YIELD FAST SCINTILLATOR

The invention pertains to new scintillating materials, in particular in the form of single crystals, a process to manufacture them as single crystals, and their use to detect and/or identify X-ray and/or gamma-ray radiations.

Scintillation materials are largely used for detection of gamma-rays, X-rays, cosmic rays and particles or electromagnetic waves of lower energies down to 1 keV or lower, below designated generically as "radiation".

The scintillation mechanisms rely on a number of physical principles which essentially convert the high energy of the incoming photons or particles into light which is within or reasonably close to the visible range, so it can be detected by standard photo-detectors. Of particular interest are single crystal forms of scintillators, i.e. pieces that are at the scale of use constituted of one (at most a few) crystals. A single crystal (monocrystal) configuration allows easier extraction of the emitted light over thick dimensions thanks to the lack of internal diffusion through grain boundaries, heterogeneities and other defects that tend to be present in polycrystalline materials. A crystalline structure (in the atomic sense) is required as it determines the scintillation mechanisms: a glassy, amorphous state of matter is likely to yield different scintillation properties. The extracted light is then collected with various devices well known to the man of the art, like photomultiplier tubes, photodiodes etc. Another configuration is to still retain the crystalline structure of the material, and use it in powder form, either packed or sintered or mixed with a binder in a way that still allows light extraction. Usually, those configurations are too opaque when more than a few millimeters thick, a thickness which may not be sufficient to stop enough incoming particles or photons. Overall, whenever possible and cost effective, single crystals are preferred.

Radiation detection is of major interest in a host of applications in nuclear medicine, fundamental physics, industrial gauging, baggage scanners, oil well logging etc. In those applications, it is often desirable to discriminate at a high counting rate radiations that may also reach the detector and a scintillation detector should be able to produce different luminescence signals depending on the type of radiation (see G. F. Knoll, Radiation Detection and Measurements (Wiley, New York, 2000)).

Several criteria are needed to constitute a good X-ray or gamma-ray detector.

In a way well know to the man in the field, an energy spectrum of the scintillator under incoming radiation is drawn, whereby events are represented on a histogram (with energies on the x-axis, the number of counts on the y-axis). In the acquisition protocol, "channels" are defined to collect the signal within a particular energy range.

Good (low) energy resolution is necessary for good energy peak identification of the incoming radiation. Energy resolution is usually determined for a given detector at a given energy as the full width at half maximum of the peak considered on an energy spectrum, divided by the energy at the centroid of the peak (see G. F Knoll, "Radiation Detection and Measurement", John Wiley and Sons, Inc, $2^{nd}$ edition, p 114).

Another very important parameter is the decay time constant, which is described in particular by W. W Moses (Nucl. Instr and Meth. A336 (1993) 253). Fast decay times allow fast analyses. In general, the time spectrum of the collected signal from a scintillator under radiation can be fitted by a sum of exponentials characterized each by a decay time constant. The quality of a scintillator is determined essentially by the contribution of the fastest emission component. This is the number we report further in the text.

A family of known scintillator crystals widely used is of the thallium-doped sodium iodide Tl:NaI type. This scintillating material, discovered in 1948 by Robert Hofstadter and which forms the basis of modern scintillators, still remains the predominant material in this field in spite of almost 60 years of research on other materials. However these crystals have a scintillation decay which is not very fast.

One family of scintillator crystals that has undergone considerable development is of the bismuth germanate (BGO) type. The crystals of the BGO family have high decay time constants, which limit the use of these crystals to low count rates.

Recently, scintillating materials have been disclosed by O. Guillot-Noël et al. ("Optical and scintillation properties of cerium-doped $LaCl_3$, $LuBr_3$ and $LuCl_3$" in Journal of Luminescence 85 (1999) 21-35). This article describes the scintillation properties of cerium-doped compounds such as $LaCl_3$ doped with 0.57 mol % Ce; $LuBr_3$ doped with 0.021 mol %, 0.46% mol % and 0.76 mol % Ce; $LuCl_3$ doped with 0.45 mol % Ce. These scintillating materials have quite useful energy resolutions, of the order of 7%, and decay time constants of the fast scintillation component that are fairly low, especially between 25 and 50 ns. However the intensity of the fast component of these materials is low, especially of the order of 1000 to 2000 photons per MeV, which means that they cannot be used as a component of a high-performance detector.

Figure 1:
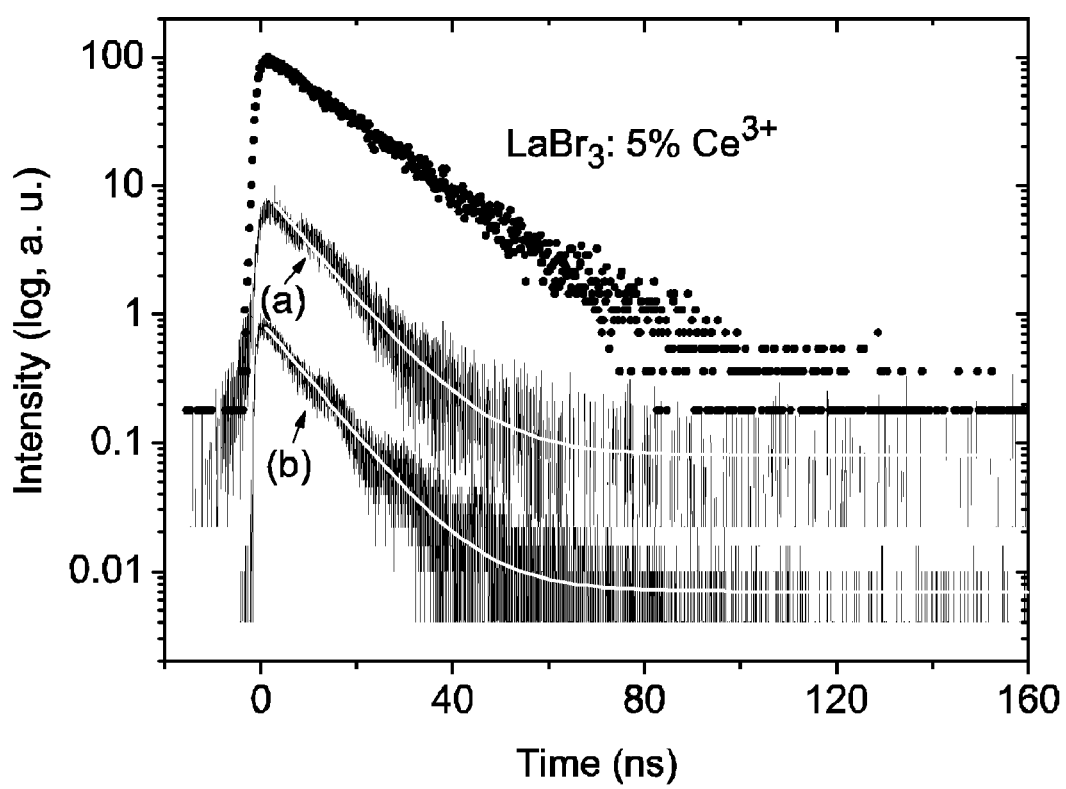
FIG. 1 shows scintillation decay time spectra of $PrBr_3$ 5% $Ce^{3+}$ and $PrBr_3$: 20% $Ce^{3+}$ recorded at room temperature under $^{137}Cs$ γ-ray excitation using single-photon-counting techniques. The Scintillation decay curves at room temperature of (a) $PrBr_3$: 5% $Ce^{3+}$ and (b) $PrBr_3$: 20% $Ce^{3+}$ can be seen. For comparison, the scintillation decay spectrum of $LaBr_3$: 5% $Ce^{3+}$ is also plotted.

The present invention pertains to a new material containing praseodymium halide and cerium halide showing a remarkably low decay time (often written τ). The material of the invention comprises a compound of formula $Pr_{(1-x-y)}Ln_yCe_xX_3$, wherein
  Ln is chosen from La, Nd, Pm, Sm, Eu, Gd, Y or a mixture of at least two of them (La, Nd, Pm, Sm, Eu, Gd, Y),
  x is above 0.0005 and lower than 1;
  x is preferably above 0.005;

x is preferably less than 0.9 (=less than 90 mol %) and preferably less than 0.4;

X is chosen from the halides Cl, Br, I or mixtures of at least two halides of the group: Cl, Br, I, y can be 0 and goes from 0 to less than 1 and preferably up to 0.9 and is preferably less than $(1-x)/2$, $(x+y)$ is less than 1.

Preferably, if X is I (Iodine) or a mixture of halides containing 50 mol % or more of the halide I, Ln is chosen from the group: La, Nd, or a mixture of both. Preferably, if X is containing less than 50 mol % of the halide I (Iodine), Ln is chosen from the group: La, Nd, Pm, Sm, Eu, Gd, Y or a mixture of at least two of them.

Present invention concerns more in particular the material consisting essentially of the compound of formula $Pr_{(1-x-y)}Ln_yCe_xX_3$ and more particularly the material consisting of the compound of formula $Pr_{(1-x-y)}Ln_yCe_xX_3$.

The compound $Pr_{(1-x)}Ce_xX_3$ (wherein x and X have the same signification than explained above, and y is 0) is more particularly concerned. In particular, the compound $Pr_{(1-x)}Ce_xBr_3$ (wherein x has the same signification than explained above, and y is 0) is preferred.

The value x is the molar level of substitution of Pr by cerium, subsequently called "cerium content". The value x is above 0.0005, but it can also be said that x is above 0.05 mol %. Both wordings are equivalent. As an example, if x is 0.05 and y is 0, the concerned compound can be written: $PrBr_3$:5% Ce. Such wording is well used by the man skilled in the art.

The value y is the molar level of substitution of Pr by Ln.

An inorganic scintillating material according to the invention substantially consists of $Pr_{(1-x)}Ce_xX_3$ and may also comprise impurities usual in the technical field of the invention. In general, the usual impurities are impurities coming from the raw material whose content is in particular less than 1 mol %, or even less than 0.1 mol % (case of solubilized impurities). In case of unwanted phases, the volume percentage of these unwanted phases is especially less than 1%.

The scintillating material of the invention can be manufactured under the form of a monocrystal. In this case, its volume is generally at least 10 $mm^3$. The material can also be used in the form of a powder (polycrystalline), possibly either packed or sintered or mixed with a binder.

The compounds in the examples were grown as single crystals by the vertical Bridgman technique. Because the compounds are hygroscopic the experiments were performed on samples sealed in quartz ampoules. Other known techniques to the man in the field of crystal growths could be used such as Czochralski or Kyropoulos techniques, provided the material is reasonably protected from reaction with water and oxygen. The single crystal samples in the examples were about 10 $mm^3$ in volume.

The properties of $PrBr_3$:$Ce^{3+}$ are given in Table 1 below, along with those of the scintillators already known in the field of gamma-ray detection.

TABLE 1

Comparative properties of $PrBr_3$:$Ce^{3+}$ and other gamma-ray scintillators.

| Compound | LY (ph/MeV) | R (%) | τ (ns) | density | $\lambda_{em}$ (nm) |
|---|---|---|---|---|---|
| $PrBr_3$:5% Ce | 16000 | 5.5 | 10 | 5.3 | 370 |
| $PrBr3$:20% Ce | 21000 | 6.9 | 10 | 5.3 | 390 |
| $LaCl_3$:10% Ce | 45000 | 4 | 28 | 3.9 | 350 |
| $LaBr_3$:5% Ce | 60000 | 2.8 | 16 | 5.3 | 380 |

The following abbreviations were used in table 1:
LY=Light yield
R=energy resolution
τ=decay time
$\lambda_{em}$=wavelength of the main peak of light emission
5% Ce means that x=0.05 in the generic formula which is in fact $Pr_{0.95}Ce_{0.05}Br_3$.

Scintillation decay time spectra of $PrBr_3$: 5% $Ce^{3+}$ and $PrBr_3$: 20% $Ce^{3+}$ recorded at room temperature under 137Cs γ-ray excitation using single-photon-counting techniques are shown in FIG. 1. On this figure, the Scintillation decay curves at room temperature of (a) $PrBr_3$: 5% $Ce^{3+}$ and (b) $PrBr_3$: 20% $Ce^{3+}$ can be seen. These spectra were recorded using a single-photon counting technique. Solid lines through the data are single exponential fits. For comparison, the scintillation decay spectrum of $LaBr_3$: 5% $Ce^{3+}$ is also plotted.

The fast component reported for the 5 mol % cerium-doped $PrBr_3$ represents 90% of the emitted light, a very high number that increases the advantage of the scintillator material over other gamma-ray detectors with respect to its fast component.

Figure 2:
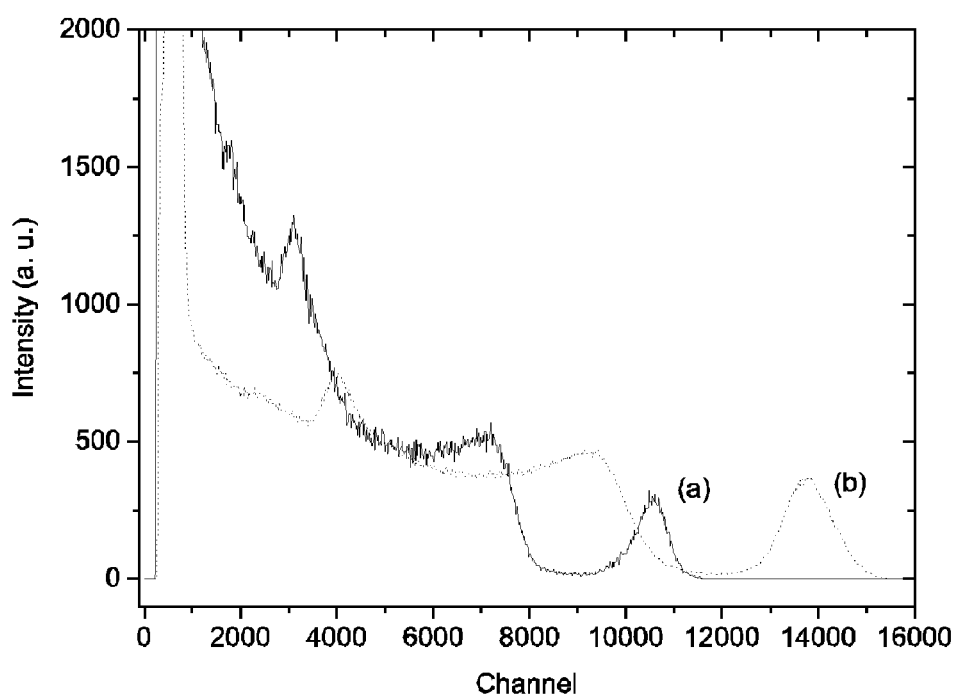
FIG. 2 shows pulse height spectra of radiation from a $^{137}Cs$ source recorded with (a) $PrBr_3$: 5% $Ce^{3+}$ and (b) $PrBr_3$: 20% $Ce^{3+}$ for 662 keV γ-rays.

FIG. 2 shows pulse height spectra of radiation from a $^{137}Cs$ source recorded with (a) $PrBr_3$: 5% $Ce^{3+}$ and (b) $PrBr_3$: 20% $Ce^{3+}$ for 662 keV γ-rays.

It is known to the man skilled in the art that the scintillation properties of a crystal are tightly related to its structure (known as "space group"). It is also known to the man skilled in the art that crystals having the same space group can easily mix and form a crystalline solid solution. The space group of $PrCl_3$ and of $PrBr_3$ is $P6_3/m$. This is the same space group as for $LaX_3$, $CeX_3$, $NdX_3$, $PmX_3$, $SmX_3$, $EuX_3$ and $GdX_3$, with X: Cl or Br or a mixture of both. The space group of $PrI_3$ is Cmcm. This is the same space group as for $LaI_3$, $CeI_3$, $NdI_3$.

It is shown in particular that materials of the invention constitute interesting gamma detectors, less bright than the $LaBr_3$:Ce known in the field of gamma detection, with a poorer energy resolution but much faster decay. It is worth adding that the energy resolution figures given for the samples of the invention do not constitute a fundamental limit for the claimed compositions. It is well known to the man of the art that energy resolution can be improved with crystals of good crystallinity and homogeneity. Homogeneity in Ce contents, low inclusion and defect levels are preferred. Such crystals can be obtained for instance in well controlled furnaces, with the adequate choice of thermal conditions, of thermal gradients at the solid/liquid interface and of the growth rate feedback loop, as is well know to the man of the art to obtain homogeneous crystals.

Such very fast decay is of particular interest for high count rate applications, where the number of incoming photons to be detected is extremely high, above 100 kilocounts per second (kcps), or even above 1 Mcps. This is of particular interest but not exclusively in spectroscopic analyses (where a sample is intentionally bombarded by a high flux of X-rays), or in PET scanners (Positron Tomography Emission). PET scanners with Time of Flight capabilities, which require extremely fast timing properties, could advantageously use the product of the invention.

Thus, present invention concerns also a scintillation detector (scintillator) containing the material of the invention.

Present invention is also described in the following, presented as chapters 1 to 5:

1. INTRODUCTION $Ce^{3+}$ doped lanthanide trihalides scintillator ($REX_3$: $Ce^{3+}$ with RE=La, Gd, Lu, Y and X=F, Cl, Br, I) were investigated in recent years in the search for the better scintillators. $LaCl_3$:

Ce$^{3+}$, LaBr$_3$: Ce$^{3+}$ and LuI$_3$: Ce$^{3+}$ have excellent scintillation properties including high light yield, good energy resolution, and fast decay time [1-4]. Despite these achievements, there is still an endeavor for searching a better scintillator.

Beside Ce$^{3+}$ there are also efforts to introduce Pr$^{3+}$ as an activator in compound [5]. Theoretically, the 5d→4f emission in Pr$^{3+}$ should be a factor 2 to 3 faster than in Ce$^{3+}$ due to the higher energy 5d→4f emission of Pr$^{3+}$ as compared to Ce$^{3+}$ [6]. Unfortunately, development of LaBr$_3$: Pr$^{3+}$ as a new fast scintillator was not successful. It does not show the anticipated 5d→4f emission; instead slow 4f→4f emission is observed. The charge transfer from the valence band to Pr$^{3+}$ occurs at energy below the energy of 5d→4f emission, and this quenches Ce$^{3+}$ emission [7].

In this work, we report on the scintillation properties of PrBr$_3$: Ce$^{3+}$. Its light yields of 16,000 and 21,000 photons/MeV are four times less than that of LaBr$_3$: Ce$^{3+}$. On the other hand, the 5.6 ns decay time of Ce$^{3+}$ emission at RT of PrBr$_3$: Ce$^{3+}$ is three times faster than that of LaBr$_3$: Ce$^{3+}$. Spectroscopy of PrBr$_3$: Ce$^{3+}$ is also presented.

2. EXPERIMENTAL PROCEDURES

Relatively small (5×3×2 mm$^3$) single crystals of PrBr$_3$: 5% Ce$^{3+}$ and PrBr$_3$: 20% Ce$^{3+}$ were cut from the original crystal boules grown from PrBr$_3$ and CeBr$_3$ powder by the Bridgman technique. Starting materials were prepared from Pr$_2$O$_3$ (Heraeus, 99.999%), NH$_4$Br (Merck, >99.9%), and HBr (47% Merck, proanalysis) by the ammonium halide method [8,9]. PrBr$_3$ crystallizes in the UCl$_3$ type structure with space group P6$_3$/m (no. 176) [10]. Based on its structure and lattice parameters, PrBr$_3$ has a calculated density $\rho_r$ of 5.27 g/cm$^3$ and an effective atomic number $Z_{eff}$ of 48.27. Details on experimental setups can be found in Reference [4].

3. RESULTS AND DISCUSSION

Figure 3:
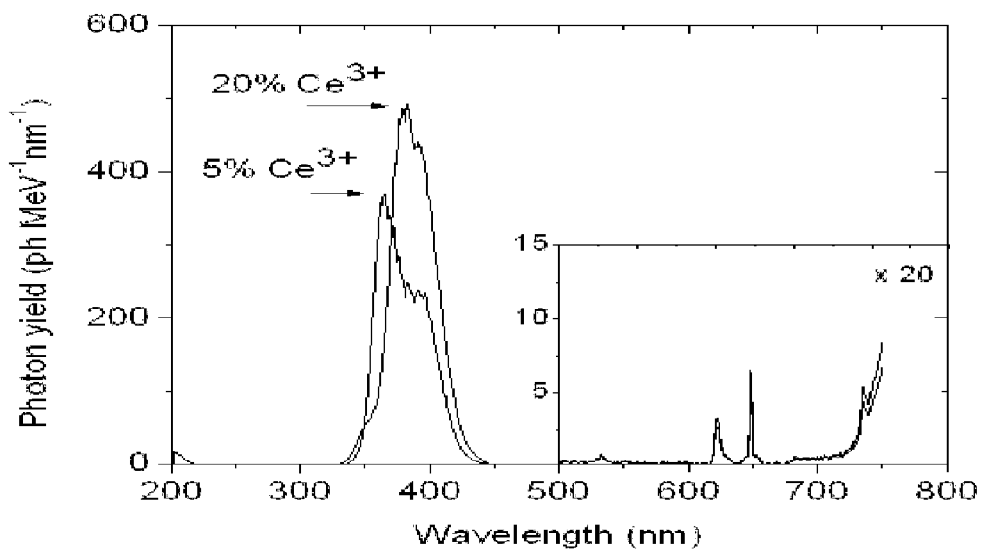
FIG. 3 shows X-ray excited emission spectra recorded at RT of $PrBr_3$: 5% $Ce^{3+}$ and $PrBr_3$: 20% $Ce^{3+}$. The y-axis has been calibrated using light yields derived from pulse height spectra. The spectra ranged from 500 to 750 nm are enlarged by factor of 20 from their actual intensity.

The X-ray excited emission spectra of PrBr$_3$: 5% Ce$^{3+}$ and PrBr$_3$: 20% Ce$^{3+}$ recorded at RT are shown in FIG. 3. Each spectrum has been corrected for the transmission of the system and normalized in such a way that the integral over all wavelengths is equal to the absolute light yield in photons/MeV as obtained from pulse height spectra recorded with shaping time of 10 μs.

The spectra are dominated by two main overlapping bands peaked at 365 and 395 nm due to Ce$^{3+}$ emission. The location of this Ce$^{3+}$ emission is similar to that of LaBr$_3$: Ce$^{3+}$ [11]. When the Ce$^{3+}$ concentration increases, the average of Ce$^{3+}$ emission is slightly shifted to longer wavelengths and the intensity of Ce$^{3+}$ band increases. The intensity of 4f$^2$→4f$^2$ Pr$^{3+}$ lines located between 500 and 750 nm is much weaker compared to that of Ce$^{3+}$ emission. These lines in the PrBr$_3$: 5% Ce$^{3+}$ emission spectrum overlap with those in the PrBr$_3$: 20% Ce$^{3+}$ emission spectrum.

Figure 4:
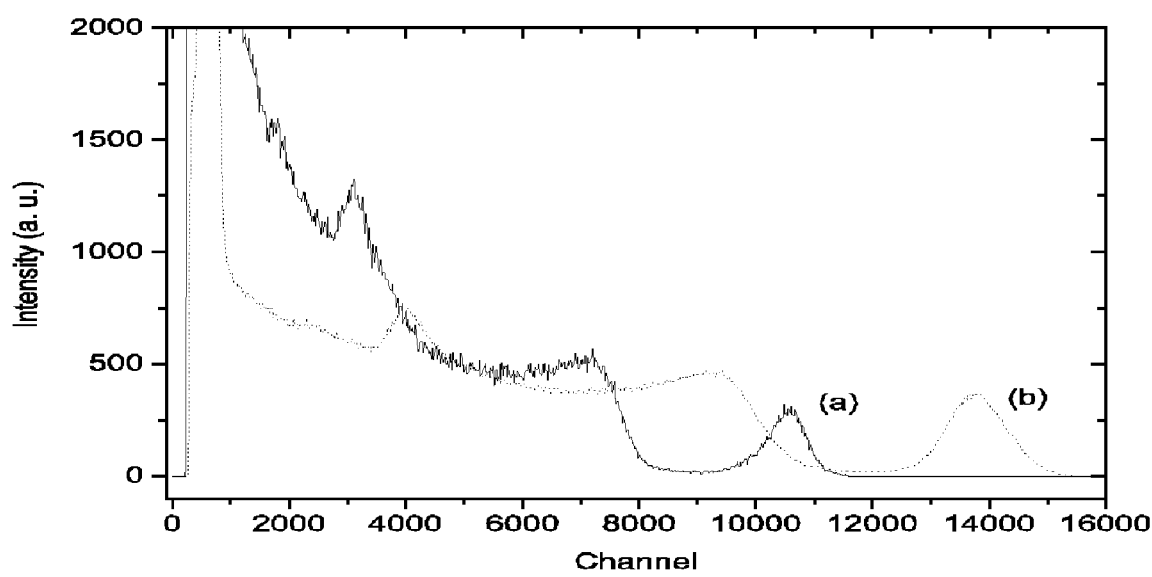
FIG. 4 shows pulse height spectra of (a) $PrBr_3$: 5% $Ce^{3+}$ and (b) $PrBr_3$: 20% $Ce^{3+}$ for 662 keV γ-rays. Spectra were measured with a Hamamatsu R1791 PMT.

FIG. 4 shows pulse height spectra of radiation from a $^{137}$Cs source recorded with PrBr$_3$: 5% Ce$^{3+}$ and PrBr$_3$: 20% Ce$^{3+}$. The satellite peaks accompanying the photopeak at lower energy due to the escape of characteristics K$\alpha$, K$\beta$ X-rays of Pr are not observed in the spectra.

Light yield and energy resolutions derived from pulse height spectra measured with a Hamamatsu R1791 PMT are presented in Table 1. The highest light yield was obtained for PrBr$_3$: 20% Ce$^{3+}$.

TABLE 1

Light yield and energy resolution derived from pulse height spectra of PrBr$_3$: 5% Ce$^{3+}$ and PrBr$_3$: 20% Ce$^{3+}$ under 662 keV γ-ray excitation measured with a Hamamatsu R1791 PMT using shaping time of 0.5, 3, and 10 μs.

| Compound | Light yield (10$^3$ photons/MeV) | | | Energy Resolution R (%) |
|---|---|---|---|---|
| | 0.5 μs | 3 μs | 10 μs | |
| PrBr$_3$: 5% Ce$^{3+}$ | 14.3 ± 1.4 | 15.2 ± 1.5 | 15.6 ± 1.5 | 5.5 ± 0.5 |
| PrBr$_3$: 20% Ce$^{3+}$ | 19.1 ± 1.9 | 20.3 ± 2.0 | 20.7 ± 2.0 | 6.9 ± 0.7 |

Figure 5:
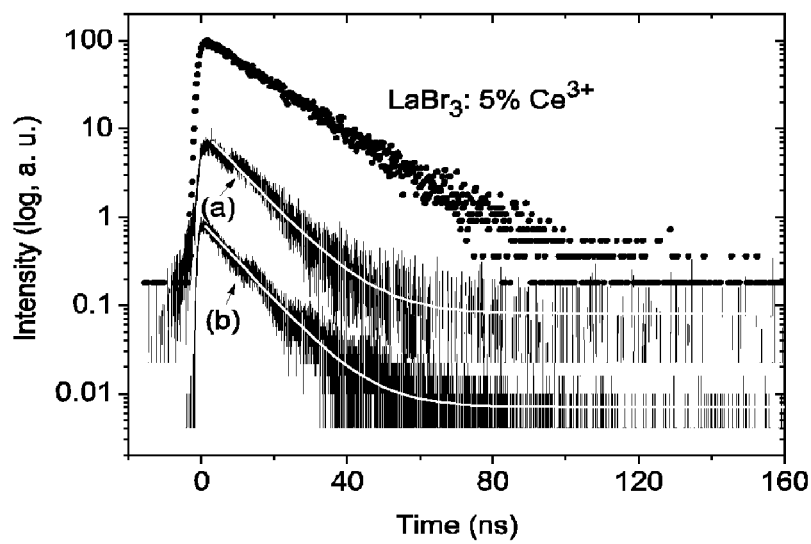
FIG. 5 shows scintillation decay curves at room temperature of (a) $PrBr_3$: 5% $Ce^{3+}$ and (b) $PrBr_3$: 20% $Ce^{3+}$. These spectra were recorded using a single-photon counting technique. Solid lines through the data are single exponential fits. For comparison, the scintillation decay spectrum of $LaBr_3$: 5% $Ce^{3+}$ taken from Reference [12] is also plotted.

Scintillation decay time spectra of PrBr$_3$: 5% Ce$^{3+}$ and PrBr$_3$: 20% Ce$^{3+}$ recorded at room temperature under $^{137}$Cs γ-ray excitation using single-photon-counting techniques are shown in FIG. 5. Slow components in the decay curves were not observed. The decay time spectra of PrBr$_3$: 5% Ce$^{3+}$ and PrBr$_3$: 20% Ce$^{3+}$ were fitted with a single exponential decay of 10±1 ns. This decay time is faster than the scintillation decay time of LaBr$_3$: 5% Ce$^{3+}$ (~16 ns) previously reported by Bizarri et al. [12].

Figure 6:
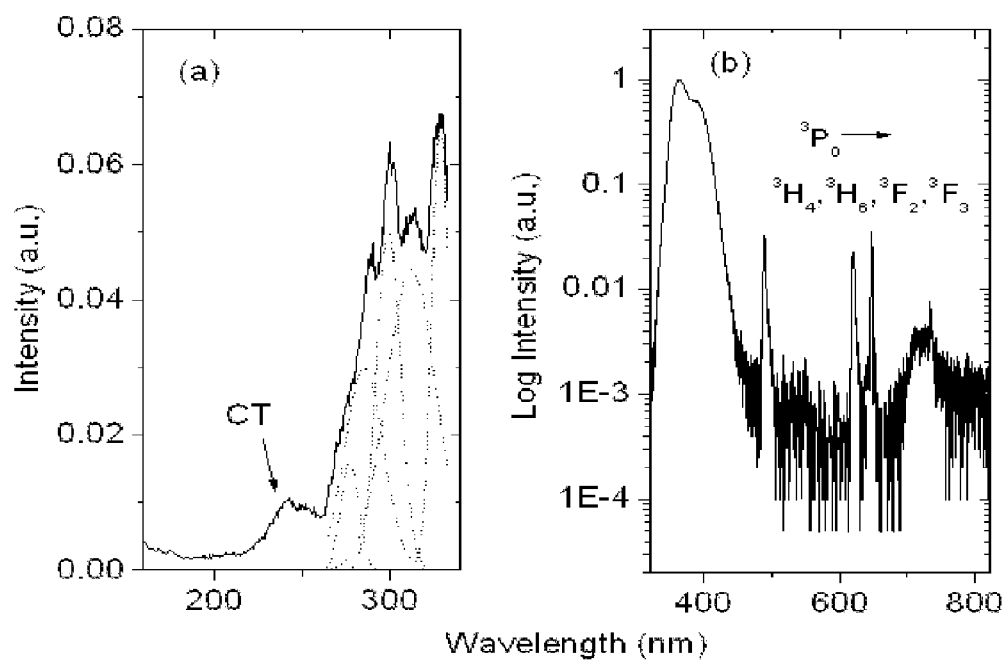
FIG. 6 shows (a) whe excitation spectrum of $PrBr_3$: 5% $Ce^{3+}$ monitoring 380 nm emission at 10 K and (b) the emission spectrum on a logarithmic scale of $PrBr_3$: 5% $Ce^{3+}$ excited at 240 nm at RT. Five gaussian fit in (a) is used to determine five $Ce^{3+}$ 4f→5d excitation bands.

The excitation and emission spectra of PrBr$_3$: 5% Ce$^{3+}$ are shown in FIG. 6. The excitation spectrum monitoring Ce$^{3+}$ emission of 380 nm recorded at 10 K shows several bands. The five bands at 277, 288, 299, 312, and 328 nm are attributed to Ce$^3$+4f→5d transitions. These bands have the same position with those of LaBr$_3$: Ce$^{3+}$ [7]. The low intensity band at 240 nm was previously observed in LaBr$_3$: Pr$^{3+}$ and assigned to charge transfer (CT) band from Br$^-$ to Pr$^{3+}$ [7]. The emission spectrum excited at CT band of Pr$^{3+}$ at 240 nm exhibits 5d→4f Ce$^{3+}$ [$^2$F$_{5/2}$, $^2$F$_{7/2}$] doublet emission and Pr$^{3+}$ 4f$^2$→4f$^2$ transition lines. The presence of Ce$^{3+}$ doublet emission when excited at the CT band of Pr$^{3+}$ shows that the energy transfer to Ce$^{3+}$ involves Pr$^{2+}$ as an intermediate state. The Pr$^{3+}$ 4f$^2$→4f$^2$ transition lines originate from the $^3$P$_0$ state. The absence of transitions from the $^3$P$_1$ state is probably caused by energy exchange with neighboring Pr$^{3+}$ ion [13].

Figure 7:
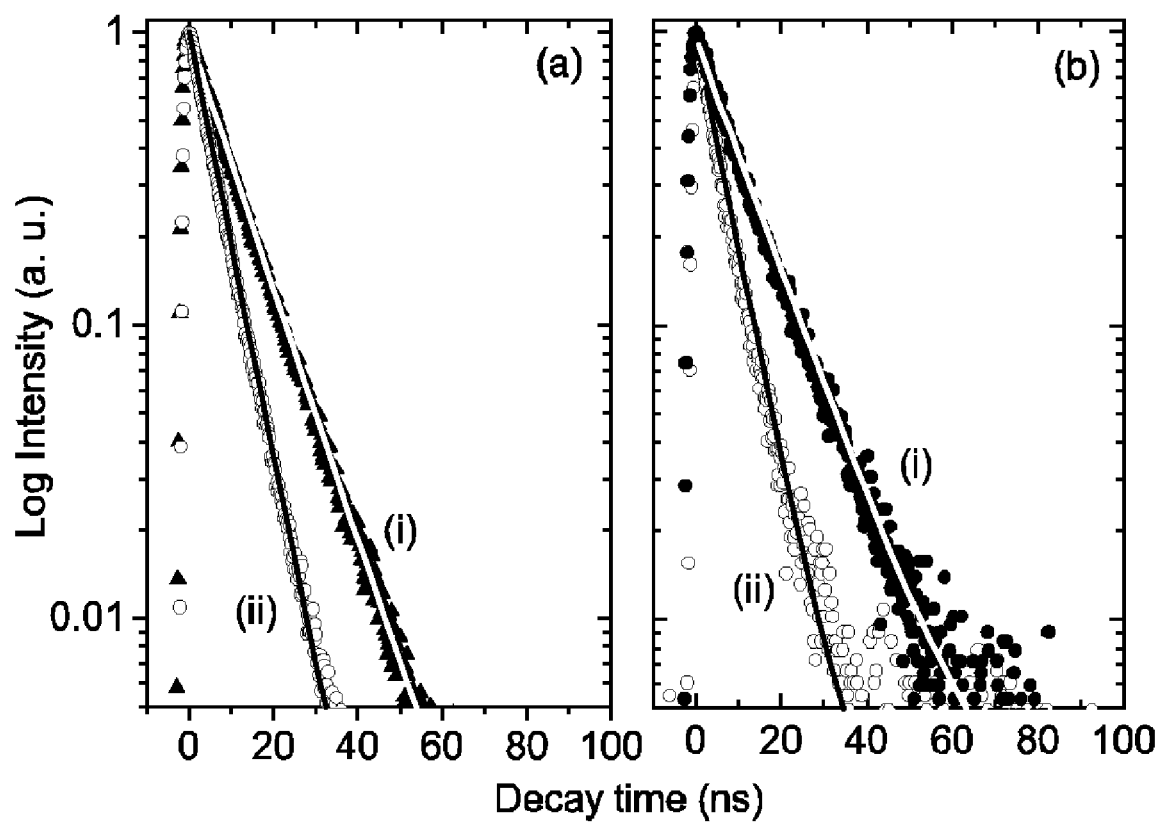
FIG. 7 shows decay time spectra on logarithmic scale of 366 nm $Ce^{3+}$ emission of $PrBr_3$: 5% $Ce^{3+}$ excited via (a) 4f→5d transition of $Ce^{3+}$ at 300 nm and (b) CT band of $Pr^{3+}$ at 250 nm recorded at (i) 10 K and (ii) RT. Solid lines drawn through the data are the single exponential fits.

FIG. 7 shows the decay time spectra of Ce$^{3+}$ emission at 366 nm of PrBr$_3$: 5% Ce$^{3+}$ upon excitation in the CT band of Pr$^{3+}$ at 250 nm and excitation of the 4f→5d transition of Ce$^{3+}$ at 300 nm recorded at 10 K and RT.

The decay time spectra were fitted with a single exponential. The decay times of Ce$^{3+}$ emission excited at 300 nm recorded at 10 K and RT, respectively, are 10.0±1.0 and 5.6±0.6 ns (see FIG. 7a). This shows that Ce$^{3+}$ emission quenches at RT. The decay times of Ce$^{3+}$ emission optically excited via the CT band of Pr$^{3+}$ at 250 nm recorded at 10 K and RT, respectively, are 11.1±1.1 and 6.0±0.6 ns (see FIG. 7b). These decay times are similar with the characteristic of the lifetime of the excited state of Ce$^{3+}$ and therefore the aforementioned energy transfer to Ce$^{3+}$ is very fast (~1 ns). It corresponds with the around 90% contribution of light yield within 0.5 μs to the total light yield. However, the decay time of Ce$^{3+}$ emission is 4-5 ns faster than the scintillation decay time (see FIG. 5). The scintillation process probably explains this difference.

FIG. 3: X-ray excited emission spectra recorded at RT of PrBr3: 5% Ce3+ and PrBr3: 20% Ce3+. The y-axis has been calibrated using light yields derived from pulse height spectra. The spectra ranged from 500 to 750 nm are enlarged by factor of 20 from their actual intensity.

FIG. 4: Pulse height spectra of (a) PrBr3: 5% Ce3+ and (b) PrBr3: 20% Ce$^{3+}$ for 662 keV γ-rays. Spectra were measured with a Hamamatsu R1791 PMT.

FIG. 5: Scintillation decay curves at room temperature of (a) PrBr3: 5% Ce3+ and (b) PrBr3: 20% Ce3+. These spectra were recorded using a single-photon counting technique. Solid lines through the data are single exponential fits. For comparison, the scintillation decay spectrum of LaBr3: 5% Ce3+ taken from Reference [12] is also plotted.

FIG. 6: (a) The excitation spectrum of PrBr3: 5% Ce3+ monitoring 380 nm emission at 10 K and (b) the emission spectrum on a logarithmic scale of PrBr3: 5% Ce3+ excited at 240 nm at RT. Five gaussian fit in (a) is used to determine five Ce3+4f→5d excitation bands.

FIG. 7: Decay time spectra on logarithmic scale of 366 nm Ce3+ emission of PrBr3: 5% Ce3+ excited via (a) 4f→5d transition of Ce3+ at 300 nm and (b) CT band of Pr3+ at 250 nm recorded at (i) 10 K and (ii) RT. Solid lines drawn through the data are the single exponential fits.

4. CONCLUSION

We have introduced a new scintillator, PrBr$_3$:Ce$^{3+}$, for γ-ray detection. The lower light yield (~16,000-21,000 photons/MeV) and the faster scintillation decay time (~10 ns) than those of LaBr$_3$: Ce$^{3+}$ were recorded. The fast energy transfer is proposed and the decay times of Ce$^{3+}$ emission recorded at 10 K and RT show that Ce$^{3+}$ emission quenches at RT.

5. REFERENCES

[1] O. Guillot-Noël, J. T. M de Haas, P. Dorenbos, C. W. E. van Eijk, K. W. Krämer, H. U. Güdel, *Jounal of Luminescence* 85 (1999) 21.

[2] E. V. D. van Loef, P. Dorenbos, C. W. E. van Eijk, K. W. Krämer, H. U. Güdel, *Appl. Phys. Lett.* 79 (2001) 1573.

[3] K. S. Shah, J. Glodo, M. Klugerman, W. Higgins, T. Gupta, P. Wong, W. W. Moses, S. E. Derenzo, M. J. Weber, P. Dorenbos, *IEEE Trans. Nucl. Sci.* 51 (2004) 2302.

[4] M. D. Birowosuto, P. Dorenbos, C. W. E. van Eijk, K. W. Krämer, H. U. Güdel, *IEEE Trans. Nucl. Sci.* 52 (2005) 1114.

[5] P. Dorenbos, R. Visser, C. W. E. van Eijk, N. M. Khaidukov, M. V. Korzhik, *IEEE Trans. Nucl. Sci.* 40 (1993) 388.

[6] P. Dorenbos, *Nucl. Instr. Meth. Phys. Res. A* 486 (2002) 208.

[7] P. Dorenbos, E. V. D. van Loef, A. J. P. Vink, E. van der Kolk, C. W. E. van Eijk, K. W. Krämer, H. U. Güdel, W. M. Higgins, K. S. Shah, *Journal of Luminescence* xx (200x) in publication.

[8] J. B. Reed, B. S. Hopkins, L. F. Audrieth, *Inorg. Synth.* 1 (1936) 28.

[9] G. Meyer, *Inorg. Synth.* 25 (1989) 146

[10] B. Schmid, B. Hälg, A. Furrer, W. Urland, R. Kremer, *J. Appl. Phys.* 61 (1987) 3426

[11] E. V. D. van Loef, P. Dorenbos, C. W. E. van Eijk, K. W. Krämer, H. U. Güdel, *Nucl. Instr. Meth. Phys. Res. A* 486 (2002) 254

[12] G. Bizarri, J. T. M. de Haas, P. Dorenbos, C. W. E. van Eijk, *IEEE Trans. Nucl. Sci.* xx (200x) in publication

[13] K. R. German, A. Kiel, *Phys. Rev. B* 8 (1973) 1846

The invention claimed is:

1. A material, comprising a compound of formula $Pr_{(1-x-y)}Ln_yCe_xX_3$, wherein
   Ln is chosen from the elements or mixtures of at least two elements, of the group: La, Nd, Pm, Sm, Eu, Gd, Y,
   X is chosen from the halides or mixtures of at least two halides, of the group: Cl, Br, I,
   x is above 0.0005 and is lower than 0.9,
   y is less than (1−x)/2 and
   (x+y) is less than 1.

2. The material according to claim 1, wherein x is above 0.005.

3. The material according to claim 1, wherein x is less than 0.4.

4. The material according to claim 1, wherein y is less than 0.9.

5. The material according to claim 1, which consists essentially of the compound of formula $Pr_{(1-x-y)}Ln_yCe_xX_3$.

6. The material according to claim 1, which consists of the compound of formula $Pr_{(1-x-y)}Ln_yCe_xX_3$.

7. The material according to claim 1, wherein y is 0.

8. The material according to claim 1, wherein X is Br.

9. The material according to claim 1, wherein X is I (Iodine) or a mixture of halides containing 50 mol % or more of the halide I and Ln is chosen from the group: La, Nd, or a mixture of both.

10. The material according to claim 1, wherein X is containing less than 50 mol % of I (Iodine).

11. The material according to claim 1, which is in the form of a monocrystal.

12. The material according to claim 11, wherein the volume of the monocrystal is at least 10 mm$^3$.

13. The material according to claim 1, which is in the form of a powder.

14. The material according to claim 1, which is either packed or sintered or mixed with a binder.

15. A scintillation detector, comprising the material of claim 1.

16. A PET scanner comprising the scintillation detector of claim 15.

17. The PET scanner of claim 16, which has Time of Flight capabilities.

18. A method of detecting gamma radiation, X-ray radiation, cosmic radiation, or a combination thereof, the method comprising converting incoming radiation into light with the material according to claim 1 and detecting the light with a photo-detector.

19. A material, comprising a compound of formula $Pr_{(1-x-y)}Ln_yCe_xX_3$, wherein
   Ln is chosen from the elements or mixtures of at least two elements, of the group: La, Nd, Pm, Sm, Eu, Gd, Y,
   X is a halide or mixtures of at least two halides, of the group: Cl, Br, I,
   x is above 0.0005 and is lower than 1,
   y is from 0 to less than (1−x)/2 and
   (x+y) is less than 1
   wherein the material is in the form of a monocrystal.

20. A scintillation detector, comprising the material of claim 19.

21. A scintillation detector containing a material comprising a compound of formula $Pr_{(1-x-y)}Ln_yCe_xX_3$, wherein
   Ln is chosen from the elements or mixtures of at least two elements, of the group: La, Nd, Pm, Sm, Eu, Gd, Y,
   X is chosen from the halides or mixtures of at least two halides, of the group: Cl, Br, I,
   x is above 0.0005 and is lower than 1,
   y is from 0 to less than 1 and
   (x+y) is less than 1,
   wherein the material is the form of a powder, either packed or sintered or mixed with a binder.

* * * * *